US010103613B2

(12) United States Patent
Sadaharu et al.

(10) Patent No.: US 10,103,613 B2
(45) Date of Patent: Oct. 16, 2018

(54) MIRROR DRIVING DEVICE

(71) Applicant: INTEL CORPORATION, Santa Clara, CA (US)

(72) Inventors: Takimoto Sadaharu, Shizuoka (JP); Kimoto Masakuni, Shizuoka (JP); Adachi Norihide, Shizuoka (JP)

(73) Assignee: INTEL CORPORATION, Santa Clara, CA (US)

( * ) Notice: Subject to any disclaimer, the term of this patent is extended or adjusted under 35 U.S.C. 154(b) by 591 days.

(21) Appl. No.: 14/760,637

(22) PCT Filed: Dec. 12, 2013

(86) PCT No.: PCT/JP2013/083359
§ 371 (c)(1),
(2) Date: Nov. 3, 2015

(87) PCT Pub. No.: WO2014/109170
PCT Pub. Date: Jul. 17, 2014

(65) Prior Publication Data
US 2016/0105090 A1    Apr. 14, 2016

(30) Foreign Application Priority Data

Jan. 11, 2013  (JP) ................................ 2013-003345
Aug. 1, 2013   (JP) ................................ 2013-160522
Aug. 1, 2013   (JP) ................................ 2013-160589

(51) Int. Cl.
*H02K 33/18*     (2006.01)
*G02B 26/08*     (2006.01)
(Continued)

(52) U.S. Cl.
CPC ........... *H02K 33/18* (2013.01); *B81B 3/0086* (2013.01); *G02B 26/0841* (2013.01);
(Continued)

(58) Field of Classification Search
CPC ........ H02K 33/18; H02K 3/26; B18B 3/0086; B18B 2201/042; G02B 26/0841; G02B 26/101
(Continued)

(56) References Cited

U.S. PATENT DOCUMENTS 4,421,381 A * 12/1983 Ueda .................. G02B 26/0816
                                                         310/36
5,912,608 A *  6/1999 Asada ................. G02B 26/085
                                                         310/36
(Continued)

FOREIGN PATENT DOCUMENTS

JP    2008-122955 A    5/2008
JP    2010-169948 A    8/2010

OTHER PUBLICATIONS

International Search Report, dated Mar. 4, 2014, Application No. PCT/JP2013/083359, Filed Date: Dec. 12, 2013 1 page.
(Continued)

*Primary Examiner* — Forrest M Phillips

(57) ABSTRACT

A mirror drive device is provided whereby conduction faults due to short-circuiting can be eliminated.
A mirror drive device 1A is provided with a fixed frame, a movable frame 14, a mirror, and a permanent magnet 10. The movable frame 14 has a substrate 100, a drive coil 18, covering layer 102 and an insulating layer 104. The substrate 100 includes a groove 100a extending in spiral fashion and located at the side of the main face S4. A drive coil 18 is constituted by metallic material arranged within the groove 100a. The covering layer 102 extends to above the main face S4 so as to cover the aperture of the groove 100a and is constituted by metallic material that suppresses diffusion of the metallic material constituting the drive coil 18. The insulating layer 104 is arranged on the main face S4 and the covering layer 102. An external-connection conductor 28b
(Continued)

that is electrically connected with the inside terminal of the drive coil 18 three-dimensionally intersects the drive coil 18, through the insulating layer 104.

16 Claims, 14 Drawing Sheets

(51) Int. Cl.
  *G02B 26/10* (2006.01)
  *B81B 3/00* (2006.01)
  *H02K 3/26* (2006.01)
(52) U.S. Cl.
  CPC ............ *G02B 26/101* (2013.01); *H02K 3/26* (2013.01); *B81B 2201/042* (2013.01)
(58) Field of Classification Search
  USPC ........................................................ 310/38
  See application file for complete search history.

(56) References Cited

U.S. PATENT DOCUMENTS

| | | | | |
|---|---|---|---|---|
| 6,774,445 | B2* | 8/2004 | Mutoh | ................ B81B 3/0072 |
| | | | | 257/415 |
| 9,467,034 | B2* | 10/2016 | Gamet | ................ B81B 3/0072 |
| 2008/0100898 | A1* | 5/2008 | Kang | .................. G02B 26/085 |
| | | | | 359/224.1 |
| 2012/0319527 | A1* | 12/2012 | Jahnes | .................. B81B 3/001 |
| | | | | 310/300 |
| 2014/0016169 | A1 | 1/2014 | Abele et al. | |
| 2016/0105090 | A1* | 4/2016 | Sadaharu | ............... H02K 33/18 |
| | | | | 310/38 |

OTHER PUBLICATIONS

Extended European Search Report received for European Patent Application No. 13871072.8, dated Aug. 30, 2016, 10 pages.
Lantasov et al., "New plating bath for electroless copper deposition on sputtered barrier layers", Microelectronic Engineering, vol. 50, No. 1-4, Jan. 2000, 7 pages.

* cited by examiner

[Fig. 1]
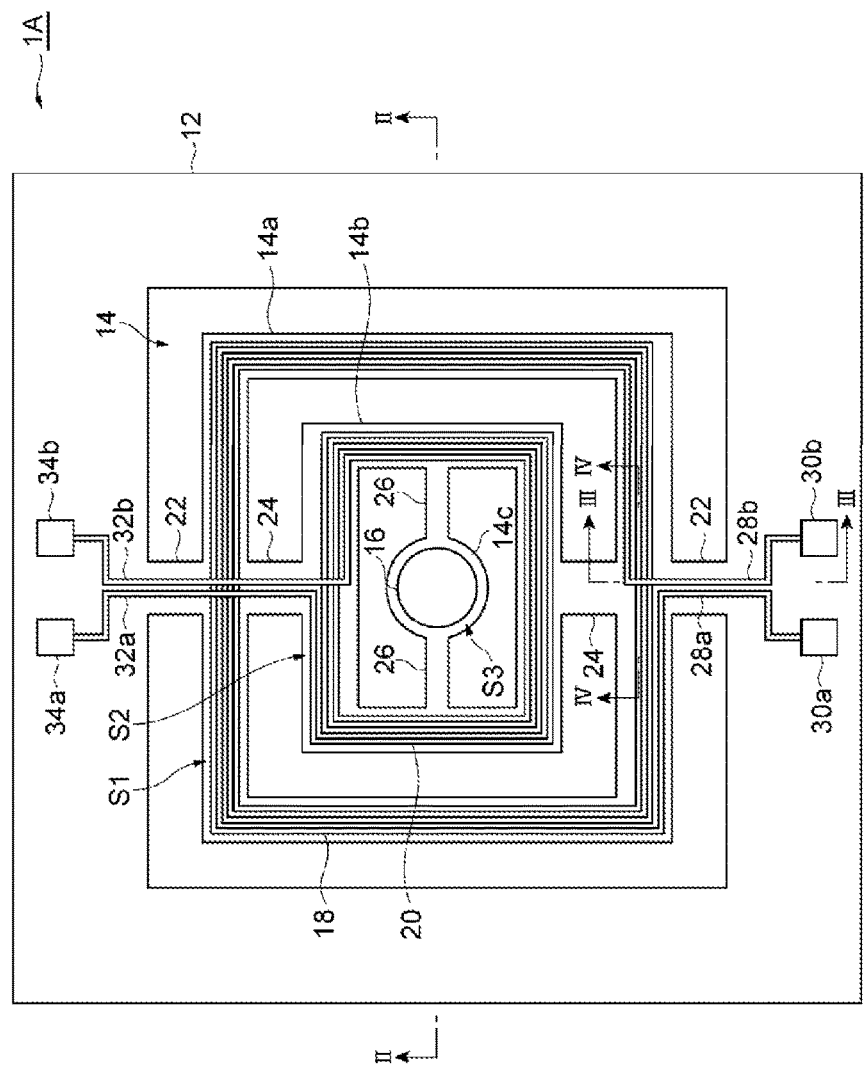

[Fig. 2]
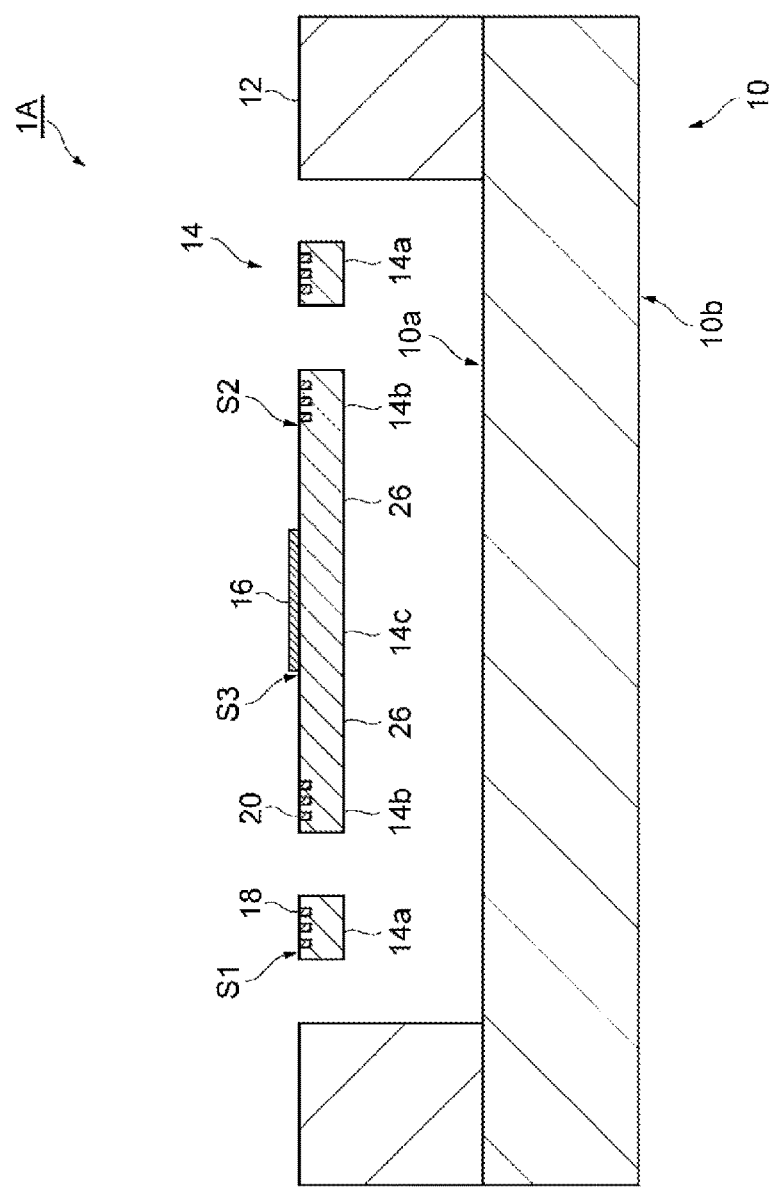

[Fig. 3]
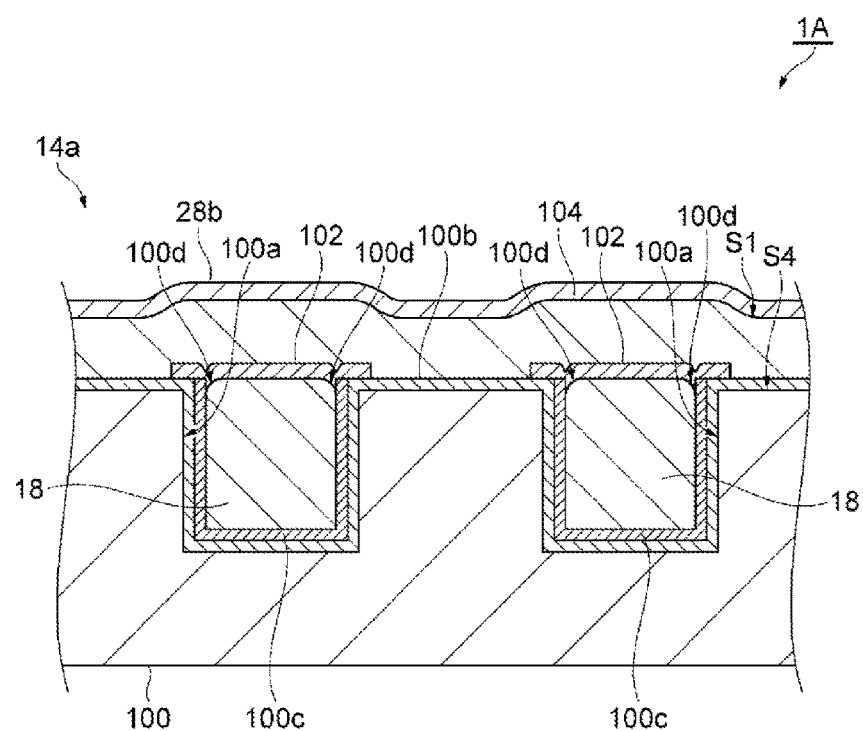

[Fig. 4]
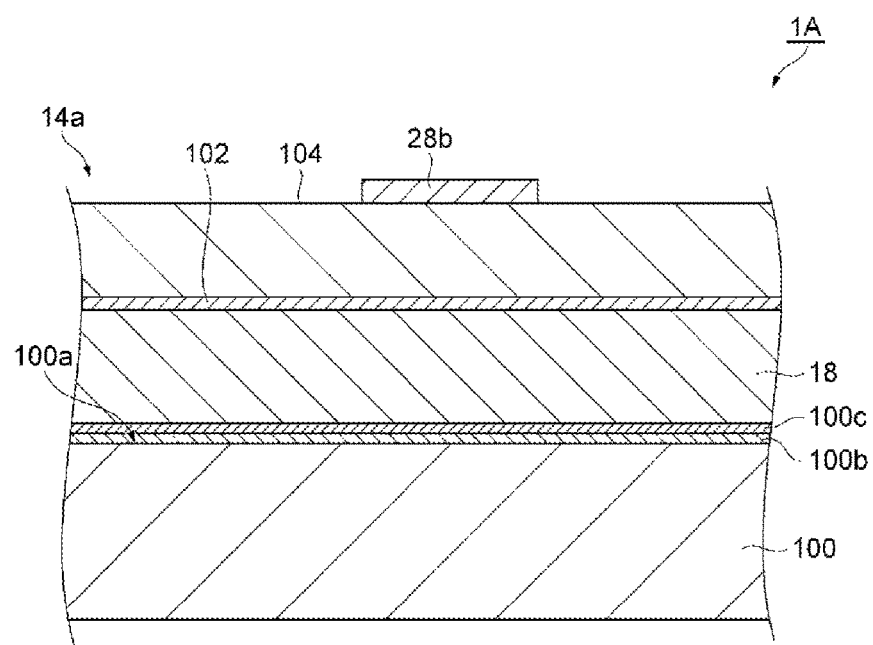

[Fig. 5]
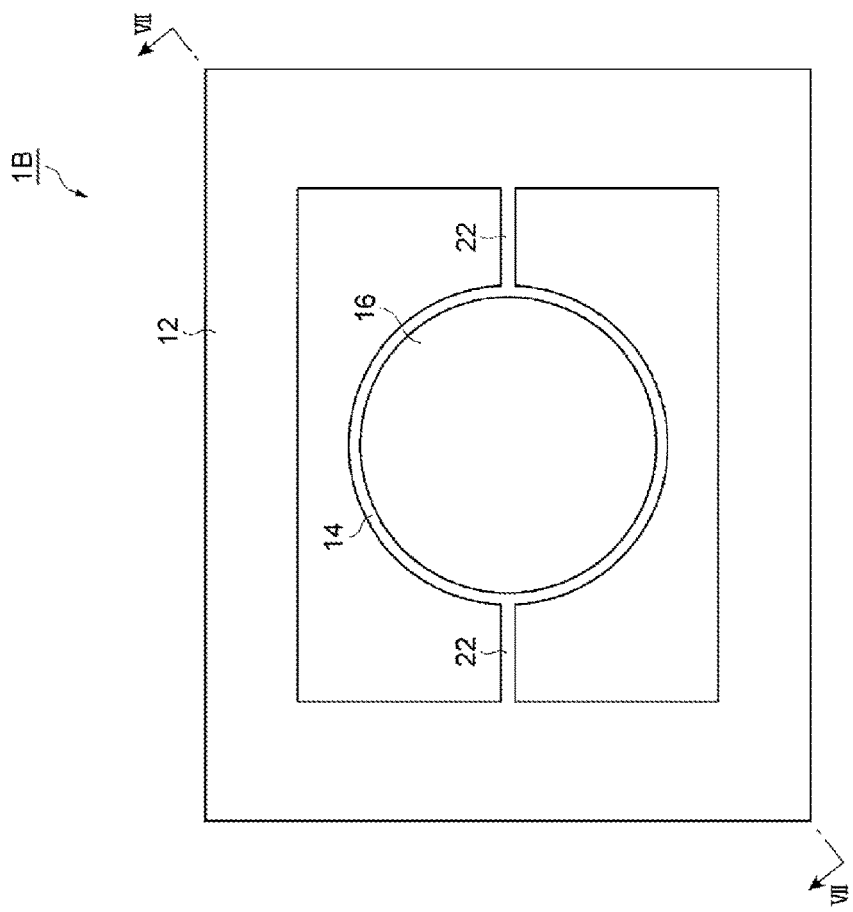

[Fig. 6]
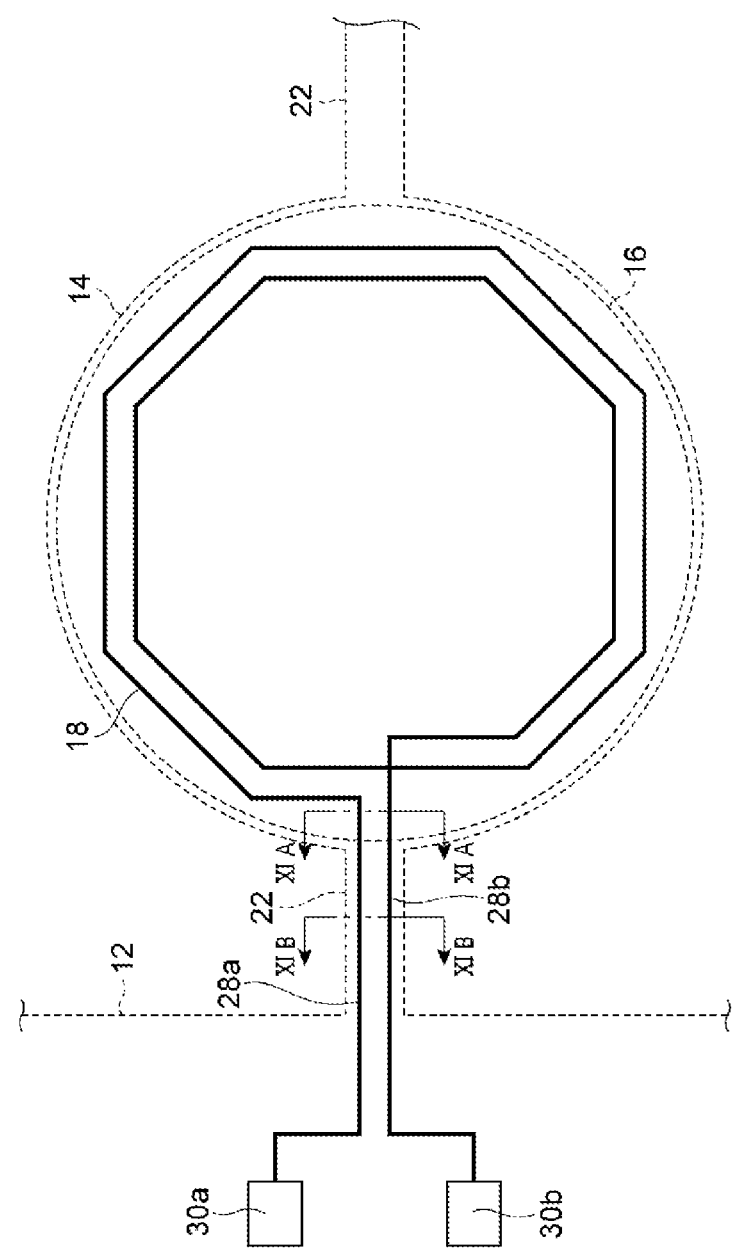

[Fig. 7]
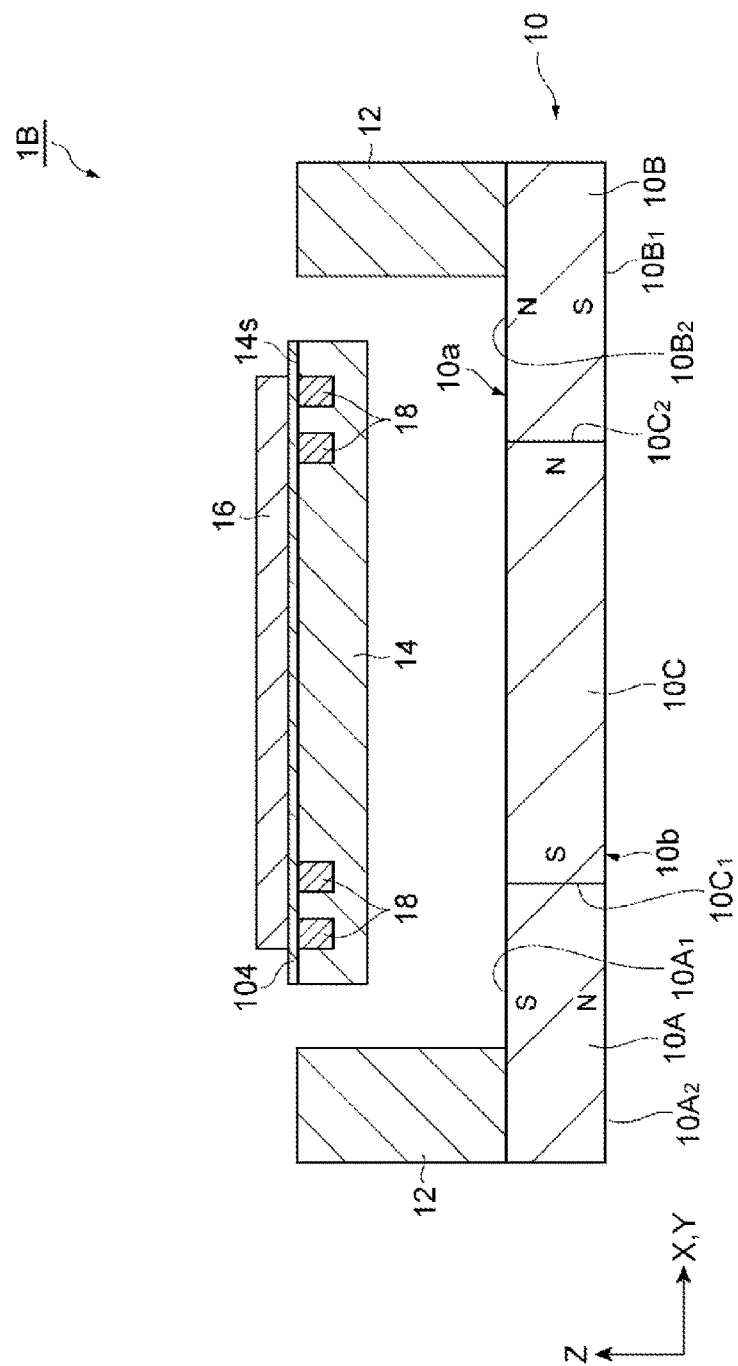

[Fig. 8]
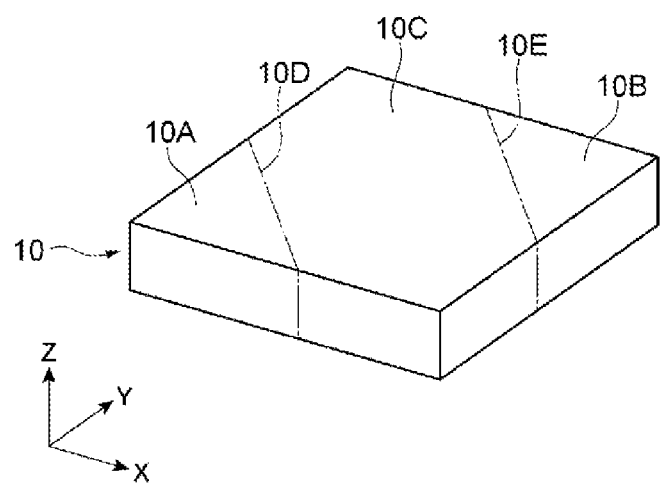

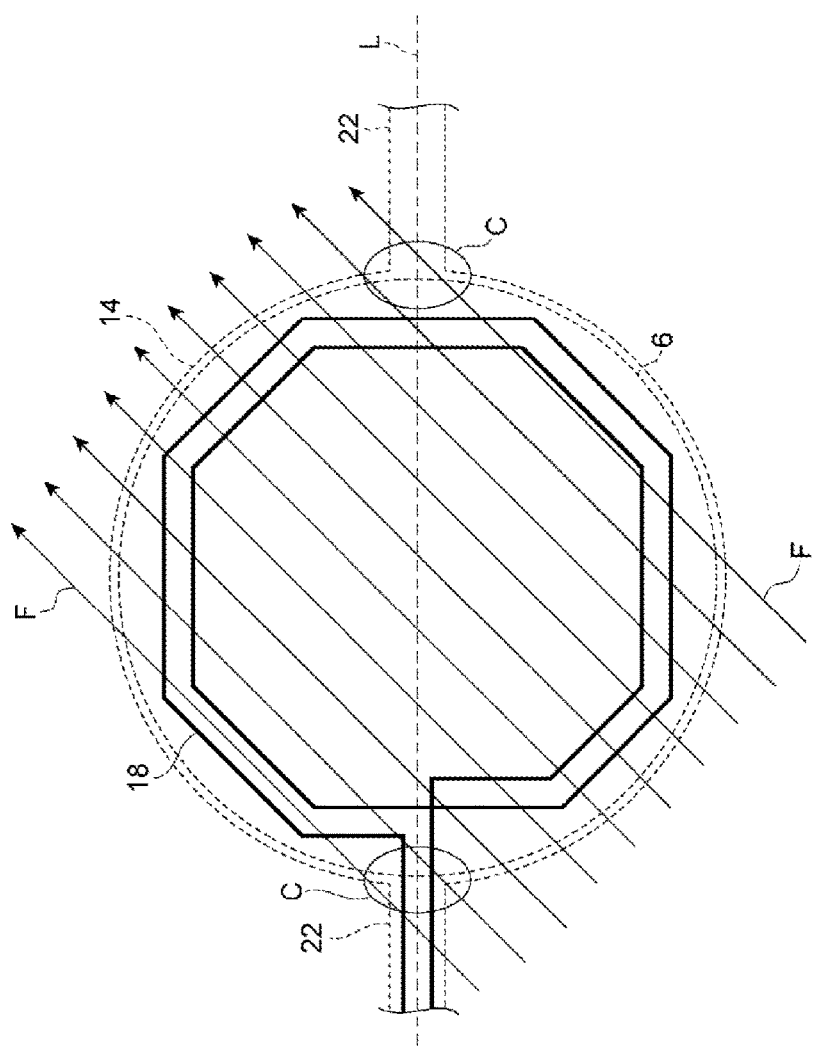
[Fig. 9]

[Fig. 10]
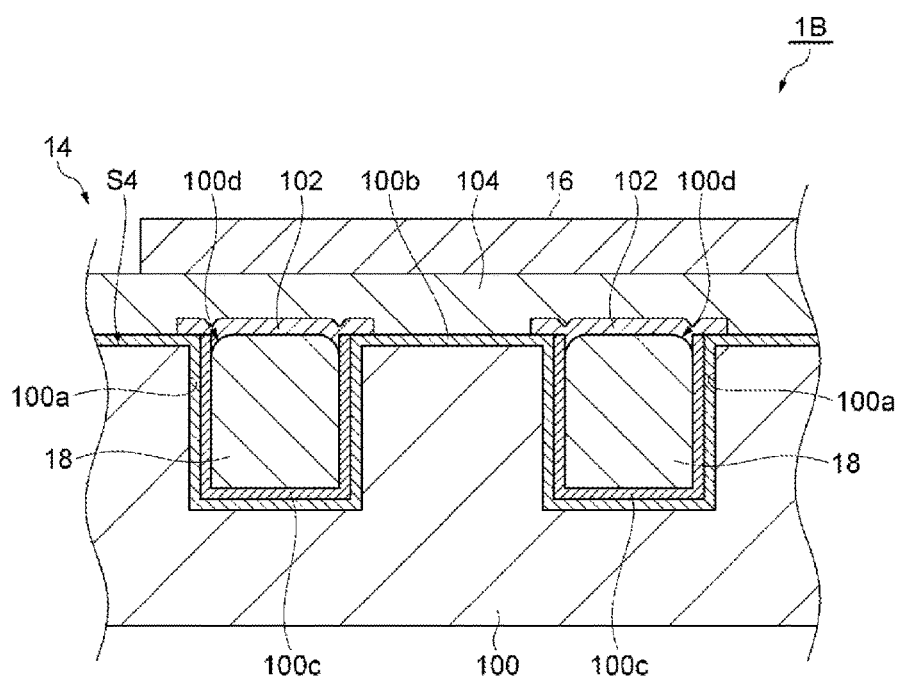

[Fig. 11]
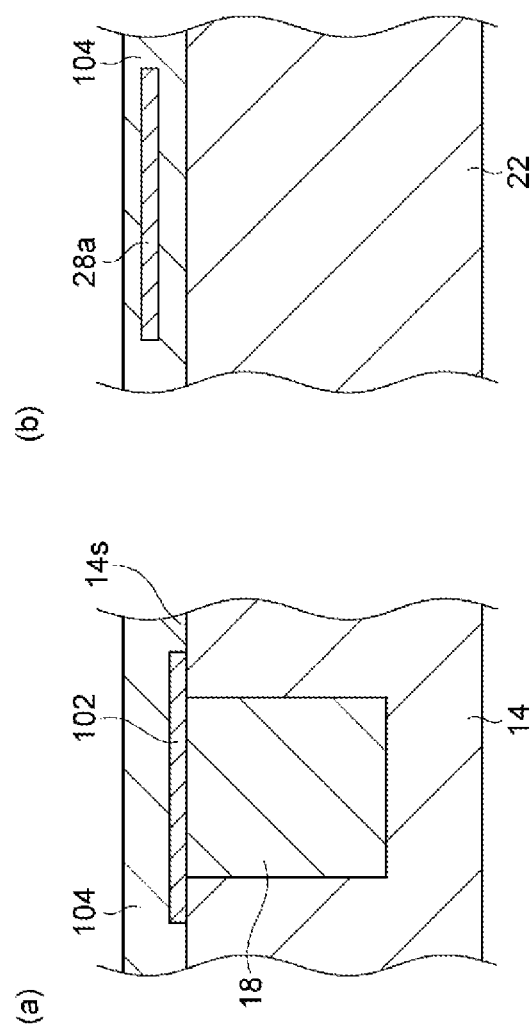

[Fig. 12]
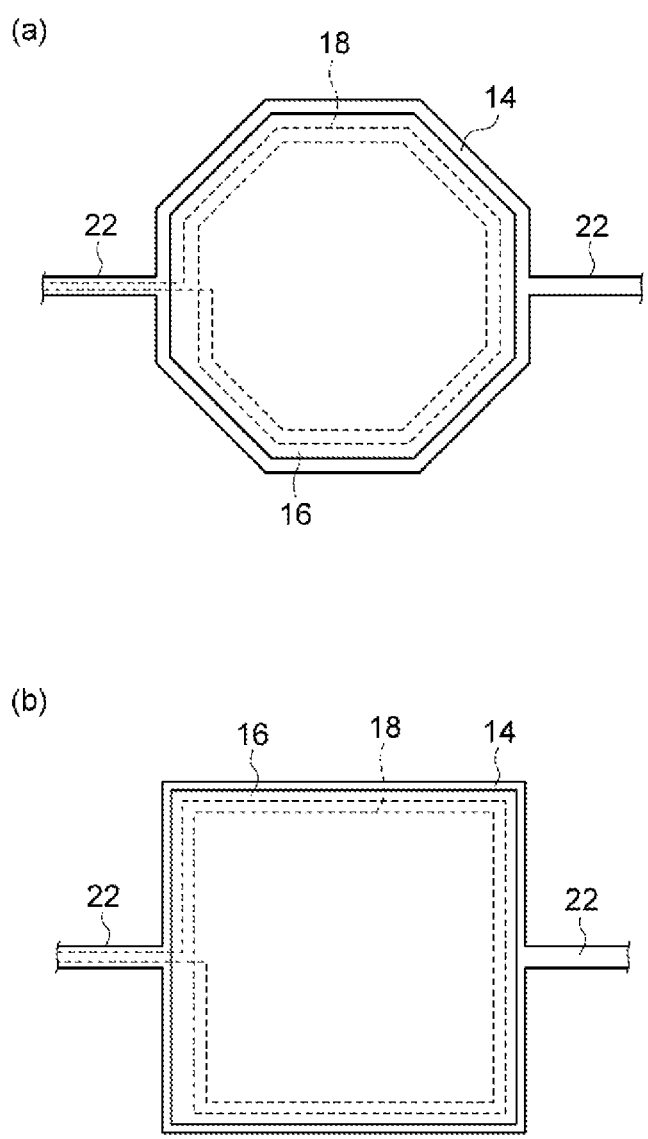

[Fig. 13]
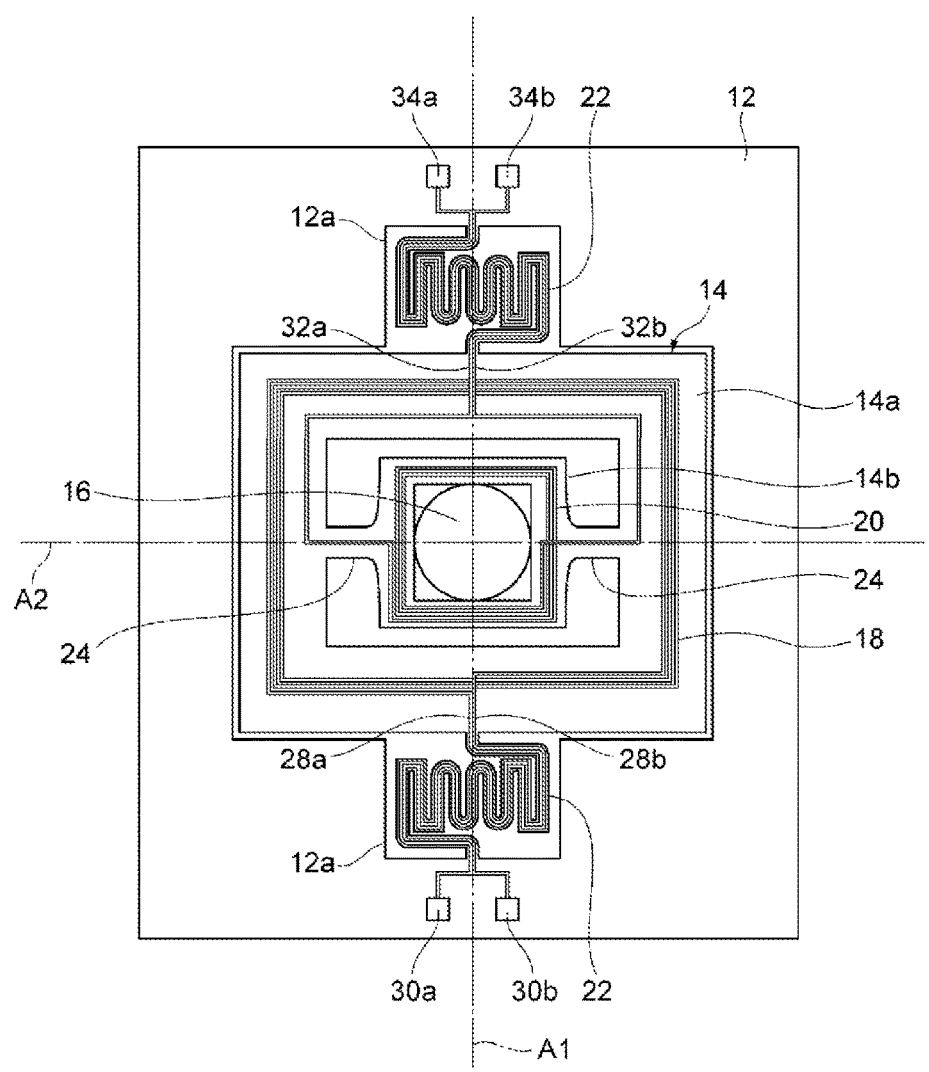

[Fig. 14]
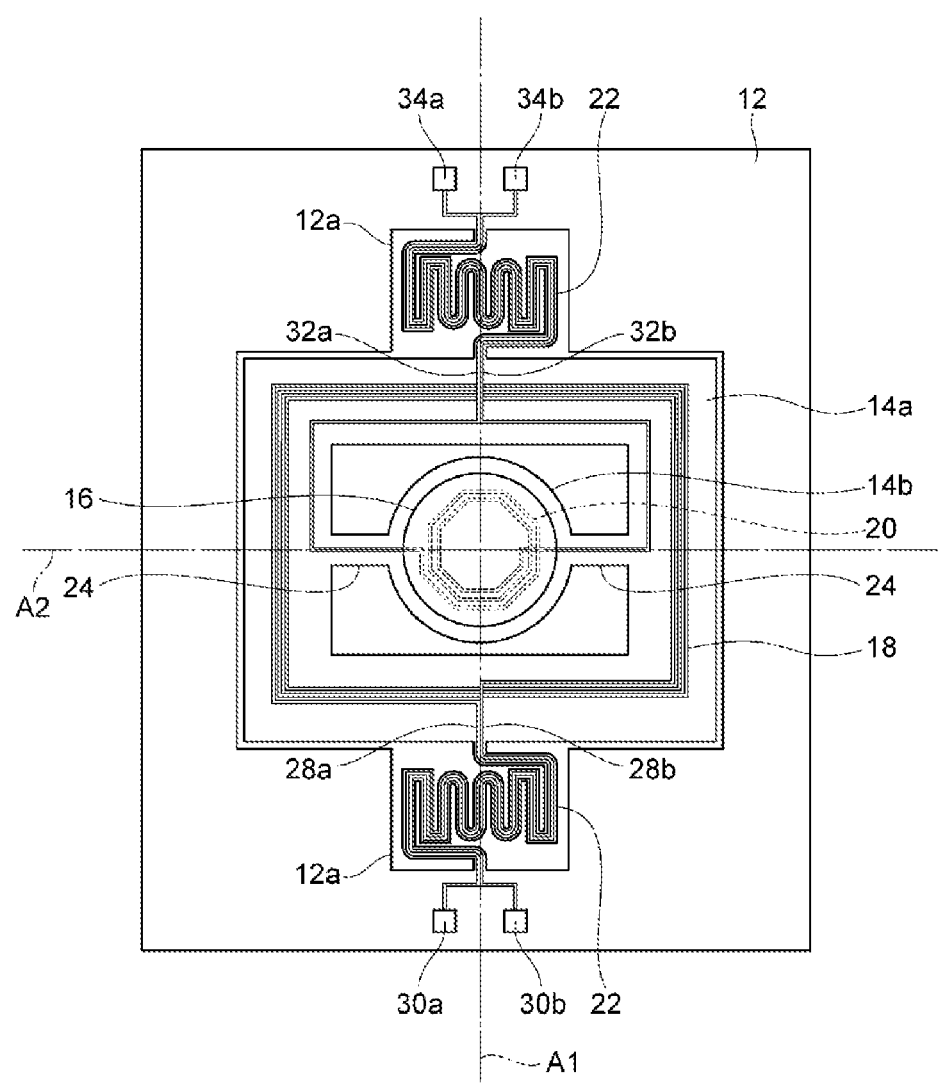

MIRROR DRIVING DEVICE

TECHNICAL FIELD

The present invention relates to a mirror drive device.

BACKGROUND ART

In recent years, there have been many studies of mirror drive devices using MEMS (Microelectronic Mechanical System) technology (also called micro-machine technology), which represent a fusion of an electronic circuit element with a mechanical element of minute size. As an example of a mirror drive system, Patent Reference 1 discloses an electromagnetic-type mirror drive device comprising a fixed frame, a movable frame, mirror, drive coil, and a pair of permanent magnets.

The movable frame is rotatably mounted with respect to the fixed frame, by means of a pair of torsion bars that extend on the same straight line. The mirror is arranged at the surface of the movable frame. The drive coil is wound in spiral fashion, seen from a direction orthogonal to the mirror surface, and is arranged on the movable frame. The pair of permanent magnets are arranged so that the drive coil is positioned therebetween, in a direction intersecting the direction of extension of the pair of torsion bars.

When current flows in the drive coil, a Lorentz force is generated in the drive coil by interaction with the magnetic field generated between the pair of permanent magnets, causing the movable frame to rotate with respect to the fixed frame. When the movable frame rotates, the direction of the mirror that is arranged at the surface of the movable portion is altered, resulting in an alteration in the optical path of the reflected light from the mirror. Such a mirror drive device is applied for example to optical switches for optical communication and/or optical scanners.

PRIOR ART REFERENCES

Patent References

Patent Reference 1: Laid-open Japanese Patent Application 2008-122955

OUTLINE OF THE INVENTION

Problem that the Invention is Intended to Solve

The aforementioned drive coil is formed by the so-called damascene process of embedding metallic material (for example Cu), by means of a seed layer, in a groove that presents a spiral shape and is formed in the surface of the silicon substrate, constituting the movable frame. In particular, if the metallic material is Cu, increasing the fineness of etching is difficult, so the damascene process is suitably employed. After embedding the metallic material in the groove, the surface is flattened by for example chemical mechanical polishing (CMP).

Because of its structure, in which the drive coil is wound in spiral fashion as seen from a direction orthogonal to the mirror surface, the drive coil needs to have an external-connection conductor for connecting the terminal that is located within this structure to the outside. In order to achieve this, after the flattening step, the surface of the drive coil, with the exception of both terminals thereof, is covered with an insulating layer and patterning of the external-connection conductor is performed in three-dimensional fashion so as to achieve intersection with the drive coil, through the insulating layer. In this way, one end of the external-connection conductor is connected with the inside terminal of the drive coil and the other end of the external-connection conductor is led to outside the drive coil.

However, in some cases, due to diffusion of the metallic material constituting the drive coil in the insulating layer, short-circuiting occurred between adjacent wirings of the drive coil or between the drive coil and the external-connection conductor. Diffusion into the insulating layer was particularly likely when the metallic material was Cu, increasing the risk of short-circuiting.

An object of the present invention is therefore to provide a mirror drive device wherein conduction faults due to short-circuiting can be eliminated.

Means for Solving the Problem

A mirror drive device according to one aspect of the present invention comprises a support section, a movable section that is supported, by means of a linking member, in rotatable fashion with respect to the support section, a mirror that is arranged on the surface of the movable section, and a magnet that forms a magnetic field around the movable section; the movable section is provided with: a substrate including a main face and a groove positioned on the side of the main face and extending in spiral fashion as seen from a direction orthogonal to the main face; a drive coil constituted by a first metallic material arranged in the groove and that is coiled in spiral fashion as seen from a direction orthogonal to the main face; a covering layer constituted by a second metallic material that suppresses diffusion of the first metallic material and extends as far as the main face so as to cover the aperture of the groove; and a first insulating layer arranged on the main face and the covering layer, wherein one end of an external-connection conductor is electrically connected with an inside terminal of the drive coil and the other end of the external-connection conductor extends to outside the drive coil, while the external-connection conductor three-dimensionally intersects the drive coil, through the first insulating layer.

In a mirror drive device according to an aspect of the present invention, the coating layer constituting the second metallic material that suppresses diffusion of the first metallic material extends as far as the main face, so as to cover the aperture of the groove. Consequently, the first metallic material that constitutes the drive coil cannot easily diffuse into the first insulating layer, so short-circuiting between adjacent wirings of the drive coil or between the drive coil and the external-connection conductor is prevented. Conduction faults due to short-circuiting are therefore eliminated. Concomitantly, since a drive coil that is coiled with high density can thereby be achieved, a larger Lorentz force acts on the drive coil. As a result, a mirror drive device with a large range of movement of the mirror can be obtained.

The first metallic material may be Cu or Au. Thus, even if Cu or Au, which are materials that are comparatively liable to diffusion, although their electrical resistance is low, is employed as the first metallic material, diffusion of these materials can be suppressed by the covering layer. Short-circuiting can thus be prevented, while lowering the electrical resistance ratio of the drive coil.

The second metallic material may be Al or an alloy containing Al. In this case, excellent suppression of diffusion of the first metallic material can be achieved.

The substrate may be provided with a second insulating layer arranged along the main face and the inside wall face of the groove.

The substrate may be constituted of silicon and the second insulating layer may be constituted by silicon oxide obtained by thermal oxidation of silicon.

A seed layer may be arranged between the second insulating layer and the first metallic material. In this case, the first metallic material may be grown on the seed layer, using an electroplating process.

The seed layer may be constituted of TiN.

A mirror drive device according to another aspect of the present invention comprises a support section, a movable section that is supported in swingable fashion with respect to the support section, a mirror that is arranged on the surface of the movable section, and a magnet that forms a magnetic field around the movable section; the movable section is provided with: a substrate including a main face and a groove positioned on the side of the main face; a drive coil constituted by a first metallic material arranged in the groove; a covering layer constituted by a second metallic material that suppresses diffusion of the first metallic material and extends as far as the main face so as to cover the aperture of the groove; and an insulating layer arranged on the main face and the covering layer.

In a mirror drive device according to another aspect of the present invention, the covering layer that is constituted by the second metallic material that suppresses diffusion of the first metallic material extends as far as the main face so as to cover the aperture of the groove. Consequently, the first metallic material constituting the drive coil cannot easily diffuse into the insulating layer, so short-circuiting between adjacent wirings of the drive coil is prevented. Conduction faults due to short-circuiting can thereby be eliminated. Concomitantly, it becomes possible to form the drive coil with higher density, so a larger Lorentz force can be applied to the drive coil. As a result, a mirror drive device with a large range of movement of the mirror can be obtained.

Beneficial Effect of the Invention

With the present invention, a mirror drive device can be provided whereby conduction faults due to short-circuiting can be eliminated.

BRIEF DESCRIPTION OF THE DRAWINGS

FIG. 1 is a plan view showing a mirror drive device according to a first embodiment of the present invention.

FIG. 2 is a cross-sectional view along the line II-II of FIG. 1.

FIG. 3 is a cross-sectional view along the line III-III of FIG. 1.

FIG. 4 is a cross-sectional view along the line IV-IV of FIG. 1.

FIG. 5 is a plan view showing a mirror drive device according to a second embodiment of the present invention.

FIG. 6 is a plan view showing a drive coil of a mirror drive device according to the second embodiment.

FIG. 7 is a cross-sectional view along the line VII-VII of FIG. 5.

FIG. 8 is a perspective view showing a permanent magnet of a mirror drive device according to a second embodiment.

FIG. 9 is a view showing diagrammatically the magnetic field formed by the permanent magnet of FIG. 8.

FIG. 10 is a partial cross-sectional view showing the movable section of the mirror drive device according to the second embodiment.

FIG. 11 is a cross-sectional view of a mirror drive device according to the second embodiment. FIG. 11(a) shows a cross section along the line XIA-XIA of FIG. 6 and FIG. 11(b) shows a cross section along the line XIB-XIB of FIG. 6.

FIG. 12 is a plan view showing a further example of a drive coil.

FIG. 13 is a view showing a further example of a mirror drive device.

FIG. 14 is a view showing a further example of a mirror drive device.

EMBODIMENTS OF THE INVENTION

Embodiments of the present invention are described with reference to the drawings, but these embodiments merely represent examples given by way of explanation of the present invention and the present invention is not intended to be restricted to the following content. In the description, identical elements or elements having the same function are given the same reference symbols and repetition of description is dispensed with.

[First Embodiment]

As shown in FIG. 1 and FIG. 2, a mirror drive device 1A according to the first embodiment comprises a permanent magnet 10, fixed frame (support section) 12, movable frame (movable section) 14 and mirror 16.

The permanent magnet 10 is a flat plate presenting a rectangular shape. The permanent magnet 10 has a pair of main faces 10a, 10b. The permanent magnet 10 forms a magnetic field around the movable frame 14 (around the drive coils 18, 20, to be described). The thickness of the permanent magnet 10 may be set at for example about 2 mm to 3 mm.

The fixed frame 12 is a frame presenting a rectangular shape. The fixed frame 12 is arranged on the main face 10a of the permanent magnet 10. The thickness of the fixed frame 12 may be set at for example about 250 µm to 300 µm.

The movable frame 14 is arranged within the aperture of the fixed frame 12. The movable frame 14 comprises an outside section 14a that is positioned on the outside, an inside section 14b that is positioned inside the outside section 14a, and a mirror arrangement section 14c whereby the mirror 16 is arranged and positioned within the inside section 14b.

The outside section 14a and the inside section 14b are frames of flat plate shape that present a rectangular shape. The outside section 14a is separated from the permanent magnet 10 and the fixed frame 12. The outside section 14a is provided with a main face S1 that faces the opposite side to that of the permanent magnet 10. The outside section 14a is mounted in rotatable fashion with respect to the fixed frame 12, by means of a pair of torsion bars (linking members) 22 that extend on the same straight line. The torsion bars 22 may be of linear shape, or may be of serpentine shape.

A drive coil 18 is arranged on the side of the main face S1 of the outside section 14a. The drive coil 18 is coiled a plurality of times in spiral fashion as seen from the direction orthogonal with respect to the main face S1 (surface of the mirror 16). One end of the drive coil 18 is positioned outside the drive coil 18, while the other end of the drive coil 18 is positioned within the drive coil 18. One end of an external-connection conductor 28a is electrically connected with the outside terminal of the drive coil 18. One end of an external-connection conductor 28b is electrically connected with the inside terminal of the drive coil 18.

The external-connection conductors 28a, 28b extend from the outside section 14a, through the torsion bar 22, as far as the fixed frame 12. The other ends of the external-connection conductors 28a, 28b are electrically connected with electrodes 30a, 30b that are arranged at the surface of the fixed frame 12. The electrodes 30a, 30b are connected with a power source, not shown. The external-connection conductor 28b intersects the drive coil 18 in three-dimensional fashion, being arranged so as to pass above the drive coil 18.

The inside section 14b is separated from the outside section 14a. The inside section 14b is provided with a main face S2 facing the opposite side to that of the permanent magnet 10. The inside section 14b is mounted in rotatable fashion with respect to the outside section 14a, by means of a pair of torsion bars 24 that extend on the same straight line as the torsion bar 22. The torsion bars 24 may present a linear shape or a serpentine shape.

The drive coil 20 is arranged on the side of the main face S2 of the inside section 14b. The drive coil 20 is coiled as a plurality of turns in spiral fashion as seen from the direction orthogonal with respect to the main face S2 (surface of the mirror 16). One end of the drive coil 20 is positioned outside the drive coil 20, while the other end of the drive coil 20 is positioned within the drive coil 20. One end of an external-connection conductor 32a is electrically connected with the outside terminal of the drive coil 20. One end of an external-connection conductor 32b is electrically connected with the inside terminal of the drive coil 20.

The external-connection conductors 32a, 32b extend from the inside section 14b as far as the torsion bar 22 and extend as far as the fixed frame 12 through the outside section 14a and torsion bar 22. The other ends of the external-connection conductors 32a, 32b are electrically connected with electrodes 34a, 34b that are arranged at the surface of the fixed frame 12. The electrodes 34a, 34b are connected with a power source, not shown. The external-connection conductor 32a three-dimensionally intersects the drive coil 18, being arranged to pass over the drive coil 18. The external-connection conductor 32b three-dimensionally intersects the drive coils 18 and 20, being arranged to pass over the drive coils 18 and 20.

A mirror arrangement section 14c is a disc presenting a circular shape. The mirror arrangement section 14c has a main face S3 facing the opposite side to that of the permanent magnet 10. The mirror arrangement section 14c is mounted on the inside section 14b by means of a pair of support beams 26 that extend on the same straight line. By linking the mirror arrangement section 14c with the inside section 14b by means of the support beams 26, it becomes difficult for Joule heating that is generated in the drive coils 18, 20 to be transmitted to the mirror arrangement section 14c; deformation of the mirror arrangement section 14c can thereby be suppressed. In the first embodiment, the direction facing the support beams 26 intersects the direction facing the torsion bars 22, 24.

The mirror 16 is arranged on the main face S3 of the mirror arrangement section 14c. The mirror 16 is an optical reflecting film constituted of a thin metal film. The metallic material used in the mirror 16 may be for example aluminum (Al), gold (Au) or silver (Ag).

Next, the detailed construction of the drive coils 18, 20 is described below. The drive coils 18 and 20 both have the same construction, so hereinbelow the drive coil 18 is described and description of the drive coil 20 is dispensed with.

As shown in FIG. 3 and FIG. 4, the outside section 14a is provided with a substrate 100, a drive coil 18, covering layer 102 and an insulating layer 104. The substrate 100 has a groove 100a that presents a shape corresponding to the drive coil 18. Specifically, the groove 100a extends in spiral fashion as seen from the side of the main face S4 of the substrate 100. Such a groove 100a may be formed by for example forming a mask of a prescribed pattern on the surface of the flat plate-shaped substrate 100 and then etching the substrate 100 through this mask. The substrate 100 is constituted for example of Si (silicon). The thickness of the substrate 100 may be set for example at about 20 µm to 60 µm.

An insulating layer 100b is arranged on the inside wall surface of the groove 100a and the main face S4 of the substrate 100. The insulating layer 100b is a thermal oxide film obtained by thermal oxidation of the substrate 100. The insulating layer 100b is constituted for example of $SiO_2$ (silicon oxide). The seed layer 100c is arranged on the inside wall face of the groove 100a. Specifically, the seed layer 100c is arranged between the insulating layer 100b and the drive coil 18. The seed layer 100c is obtained by sputtering fine metallic material having adhesion for the metallic material constituting the drive coil 18 onto the substrate 100 (insulating layer 100b). The metallic material constituting the seed layer 100c may be for example TiN.

The metallic material constituting the drive coil 18 is arranged within the groove 100a and on the seed layer 100c. The drive coil 18 is obtained by embedding this metallic material on the seed layer 100c by the damascene process. As the method of embedding this metallic material in the groove 100a, there may be mentioned by way of example plating or sputtering or CVD After arranging this metallic material in the groove 100a, the main face S4 is flattened by electrochemical polishing. In this flattening step, the boundary portion 100d where the drive coil 18 contacts the seed layer 100c may be locally reduced in thickness by for example the potential difference generated between the drive coil 18 and the seed layer 100c. As the metallic material in question, there may be mentioned by way of example Cu or Au. The thickness of the drive coil 18 is set at for example about 5 µm to 10 µm.

The covering layer 102 extends as far as the main face S4 so as to cover the aperture of the groove 100a. Specifically, the covering layer 102 covers the entire surface of the drive coil 18 on the side of the main faces S1, S4 and covers the portion of the substrate 100 surrounding the groove 100a, as seen from the direction orthogonal to the main faces S1, S4 (i.e. the surface of the mirror 16). The covering layer 102 is obtained by depositing metallic material on the entire upper surface of the substrate 100 by for example a sputtering process or CVD process and then patterning.

The metallic material constituting the covering layer 102 has the function of suppressing diffusion of the metallic material constituting the drive coil 18. As the metallic material constituting the covering layer 102, there may be mentioned by way of example Al or Al-containing alloy. As the Al-containing alloy, there may be mentioned Al—Si alloy, Al—Cu alloy or Al—Si—Cu alloy. The constituent ratio of the Al—Si alloy may be for example Al 99%, Si 1%. The constituent ratio of the Al—Cu alloy may be for example Al 99%, Cu 1%. The constituent ratio of the Al—Si—Cu alloy may be for example Al 98%, Si 1%, Cu 1%. The thickness of the covering layer 102 may be set for example at about 1 μm.

The insulating layer 104 is arranged so as to cover the substrate 100 and the covering layer 102. As the material constituting the insulating layer 104, there may be mentioned by way of example $SiO_2$, SiN or TEOS. The external-connection conductors 28a, 28b and 32a, 32b are arranged on the insulating layer 104. Specifically, the external connection conductors 28a, 28b are separated from the drive coil 18 by the insulating layer 104 and the covering layer 102.

In the first embodiment as described above, the covering layer 102 is constituted by a metallic material that suppresses diffusion of the metallic material constituting the drive coils 18, 20 and extends as far as the main face S4 so as to cover the aperture of the groove 100a. This therefore makes it difficult for the metallic material constituting the drive coils 18, 20 to diffuse into the insulating layer 104 and thereby prevents short-circuiting from occurring between adjacent wirings of the drive coils 18, 20 and between the drive coils 18, 20 and the external-connection conductors 28b, 32a, and 32b. Conduction faults due to short-circuiting can thus be eliminated. Concomitantly, since drive coils 18, 20 that are coiled with high density can thereby be achieved, a larger Lorentz force can be made to act on the drive coils 18, 20. As a result, a mirror drive device 1A with a large range of movement of the mirror 16 can be obtained.

Incidentally, in the flattening step, if the boundary portion where the drive coils contact the seed layer was locally reduced in thickness, in the case of a conventional mirror drive device, in which the covering layer 102 is absent, the distance between the drive coils and the external-connection conductors that are formed on the insulating layer covering the drive coils was small and, in particular, short-circuiting was liable to occur. However, with the first embodiment, the covering layer 102 extends not only to the surface of the drive coils 18, 20 but also as far as the main face S4 so as to cover the aperture of the groove 100a. As a result, even if the boundary portion 100d is locally reduced in thickness, conduction faults due to short-circuiting can be prevented.

In the first embodiment, the metallic material constituting the drive coils 18, 20 is Cu or Au. Even when the drive coils 18, 20 are constituted using Cu or Au, which, although their electrical resistance ratio is low, are materials which are comparatively prone to diffusion, diffusion of these materials can be suppressed by the covering layer 102. Consequently, the electrical resistance ratio of the drive coils 18, 20 can be lowered, while still preventing occurrence of short-circuiting.

In the first embodiment, the seed layer 100c having adhesion with respect to the metallic material constituting the drive coils 18, 20 is arranged between the insulating layer 100b and the drive coils 18, 20. Consequently, the metallic material constituting the drive coils 18, 20 can be grown on the seed layer 100c using an electroplating process.

[Second Embodiment]

Next, a mirror drive device 1B according to the second embodiment will be described. As shown in FIG. 5 to FIG. 8, the mirror drive device 1B comprises a permanent magnet 10, a fixed frame (support section) 12, a movable section 14 and a mirror 16.

As shown in FIG. 7 and FIG. 8, the permanent magnet 10 is a flat plate presenting a rectangular shape. The permanent magnet 10 is arranged below the movable section 14. The permanent magnet 10 has a pair of main faces 10a, 10b. The permanent magnet 10 forms a magnetic field around the movable frame 14 (around the drive coil 18, to be described).

The permanent magnet 10 is provided with a first magnetic section 10A, a second magnetic section 10B and a third magnetic section 10C. As shown in FIG. 8, the first magnetic section 10A and the second magnetic section 10B are respectively arranged, in the permanent magnet 10, at one end side and the other end side in the diagonal direction of the bottom face of the permanent magnet 10. The third magnetic section 10C is arranged between the first magnetic section 10A and the second magnetic section 10B. The boundary face 10D of the first magnetic section 10A and the third magnetic section 10C and the boundary face 10E of the third magnetic section 10C and the second magnetic section 10B are parallel with the Z axis and constitute a plane that orthogonally intersects both the X-axis and Y-axis.

The first magnetic section 10A has a magnetic pole $10A_1$ of a first polarity and a magnetic pole $10A_2$ of a second polarity different from the first polarity. The second magnetic section 10B has a magnetic pole $10B_1$ of the first polarity and a magnetic pole $10B_2$ of the second polarity. The third magnetic section 10C has a magnetic pole $10C_1$ of the first polarity and a magnetic pole $10C_2$ of the second polarity. The magnetic pole $10C_1$ is arranged in the third magnetic section 10C on the side facing the first magnetic section 10A. The magnetic pole $10C_2$ is arranged in the third magnetic section 10C on the side facing the second magnetic section 10B. In the second embodiment, the first polarity is the polarity of an S pole and the second polarity is the polarity of an N pole. Contrariwise, it would be possible for the first polarity to be the polarity of an N pole, while the second polarity is the polarity of an S pole.

The first magnetic section 10A, third magnetic section 10C and second magnetic section 10B constitute a Halbach array. Specifically, in the first magnetic section 10A, the first-polarity pole $10A_1$ and the second-polarity pole $10A_2$ are oppositely arranged in the Z axis direction. In the third magnetic section 10C adjacent to the first magnetic section 10A, the first-polarity pole $10C_1$ and the second-polarity pole $10C_2$ face each other in the direction parallel with the X and Y directions. In the second magnetic section 10B that is positioned on the opposite side of the first magnetic section 10A in relation to the third magnetic section 10C and adjacent to the third magnetic section 10C, the first-polarity pole $10B_1$ and the second-polarity pole $10B_2$ face each other in the Z axis direction. In this way, the facing directions of the two polarities that are respectively present in the adjacent pairs of the first magnetic section 10A, third magnetic section 10C and second magnetic section 10B are in mutually perpendicular directions.

The direction of the magnetic field formed by the permanent magnet 10 makes a prescribed angle (described in detail later). As shown in FIG. 9, the magnetic field F is formed along the planar direction of the surface 14s of the movable section 14, to be described. The thickness of the permanent magnet 10 can be set at for example about 2 mm to 3 mm.

The fixed frame 12 is a frame that presents a rectangular shape. The fixed frame 12 is arranged on the main face 10a of the permanent magnet 10. The thickness of the fixed frame 12 may be set at for example about 250 μm to 300 μm.

The movable section 14 is positioned within the aperture of the fixed frame 12. The movable section 14 is of flat plate form, presenting a circular shape. Herein, the expression "circular shape" includes a true circle or ellipse. In the second embodiment, the movable section 14 presents a true circular shape. The movable section 14 is swingably supported with respect to the fixed frame 12, by means of a pair of torsion bars 22. Specifically, the movable section 14 is supported in such a way that it can perform reciprocating rotational movement with respect to the fixed frame 12, by means of the pair of torsion bars 22. The pair of torsion bars 22 is linked with the fixed frame 12 and the movable section 14. The pair of torsion bars 22 is arranged in a position sandwiching the movable section 7 from both sides.

The pair of torsion bars 22 are arranged in linear fashion. In the second embodiment, the pair of torsion bars 22 extends along the straight line L shown in FIG. 9. The straight line L contains at least the pair of torsion bars 22, movable section 14 and the two connection locations C, and links the two connection locations C. Consequently, the straight line L behaves as the axis of swinging motion of the movable section 14. The direction of the magnetic field F shown in FIG. 9 makes an angle of about 45° with respect to the straight line L.

The torsion bars are not restricted to being of linear form and could be for example of serpentine shape, having a straight portion and a plurality of bent-back portions that alternately link both ends of these straight portions. In such an arrangement, the connection location of the torsion bars and the fixed frame 12 and the connection location of the torsion bars and the movable section 14 may be positioned on the same straight line, or may not be positioned on the same straight line. If these locations are not positioned on the same straight line, the direction that makes a prescribed angle with the direction of the magnetic field F may be either of the direction extending along the axis of swinging or the direction of extension of the torsion bars (linking members).

The mirror 16 is arranged on the surface 14s of the movable section 14. In the second embodiment, as shown in FIG. 5, the mirror 16 is circular in shape. The mirror 16 is a light-reflecting film constituted by a thin metallic film. The metallic material employed in the mirror 16 may be for example aluminum (Al), gold (Au) or silver (Ag).

The drive coil 18 is arranged on the movable section 14. The drive coil 18 is arranged below the mirror 16 and is embedded in the form of a planar helical winding in the movable section 14. The drive coil 18 is arranged in a position on the inside of the mirror 16 i.e. covered (hidden) by the mirror 16, as seen from the direction orthogonal to the surface 14s (main face S4 of the substrate 100, to be described) of the movable section 14. In other words, the drive coil 18 is hidden by the mirror 16, as seen from the direction orthogonal to the surface 14s of the movable section 14. As shown in FIG. 6, the drive coil 18 presents a polygonal shape, more specifically, an octagonal shape, as seen from the direction orthogonal to the surface 14s of the movable section 14.

As shown in FIG. 10, the drive coil 18 of the mirror drive device 1B according to the second embodiment chiefly differs from the drive coil 18 of the mirror drive device 1A according to the first embodiment in that, instead of the external-connection conductors 28a, 28b, 32a and 32b, the mirror 9 is arranged on the insulating layer 104.

As shown in FIG. 6, one end of the external-connection conductor 28a is electrically connected with one end of the drive coil 18. The other end of the drive coil 18 is electrically connected with one end of the external-connection conductor 28b. The external-connection conductors 28a, 28b extend along the torsion bar 22, extending as far as the fixed frame 12. The other ends of the external-connection conductors 28a, 28b are respectively electrically connected with the electrodes 30a, 30b that are arranged on the fixed frame 12. The electrodes 30a, 30b are connected with a power source, not shown.

As shown in FIG. 11(a), in the vicinity of the connection locations C of the torsion bars 22 and the movable section 14, the drive coil 18 (wiring) is formed by damascene wiring whose material is Cu or Au. Also, although not shown, at the location of connection of the torsion bars 22 and the fixed frame 12, wiring connecting the external-connection conductors 28a, 28b and the electrodes 30a, 30b is formed by damascene wiring. As shown in FIG. 11(b) in the vicinity of the middle of the torsion bars 22, the external-connection conductor 28a is formed of material such as for example Al or Al-containing alloy i.e. material that is not as easily plastically deformed as the Cu that forms the drive coil 18. The other end of the drive coil 18 and one end of the external-connection conductor 28a are electrically connected by a connecting section, not shown. As shown in FIGS. 11(a) and (b), the drive coil 18 and the external-connection conductor 28a have different height positions. Consequently, the drive coil 18 and the external-connection conductor 28a are connected by the aforementioned connecting section, which extends in a direction orthogonal to the surface 14s of the movable section 14. While in FIG. 11(b), the external-connection conductor 28a is shown, the external-connection conductor 28b has the same construction.

As described above, the mirror drive device 1B according to the second embodiment presents the same actions and beneficial effects as the mirror drive device 1A according to the first embodiment. Consequently, with the mirror drive device 1B according to the second embodiment, short-circuiting between the drive coil 18 and the mirror 16 is prevented, so conduction faults due to short-circuiting can be eliminated.

In the second embodiment, the drive coil 18 is arranged on the inside of the mirror 16, as seen from the direction orthogonal to the main face S4 of the substrate 100 and below the mirror 16. In the conventional construction, in which the drive coil is arranged around the mirror, if miniaturization is to be achieved, the mirror area has to be reduced. In contrast, in the case of the mirror drive device 1B, by adopting the construction thereof described above, miniaturization can be achieved while preserving the area of the mirror 16.

In the second embodiment, the external-connection conductors 28a, 28b arranged on the torsion bars 22 are constituted by Al or Al-containing alloy. Stress is concentrated in the middle of the linear torsion bars 22. Accordingly, since, in the case of the mirror drive device 1B, Al or Al-containing alloy, which is less subject to plastic deformation than the material (Cu or Au) forming the drive coil 18, is employed for the external-connection conductors 28a, 28b, the strength of the external-connection conductors 28a, 28b in the middle of the torsion bars 22, where stress is applied, can be preserved. Consequently, with the mirror drive device 1B, the mechanical strength of the torsion bars 22 can be preserved, and for example failure of the external-connection conductors 28a, 28b due to stress concentration can be suppressed.

Regarding the construction of the external-connection conductors 28a, 28b arranged on the aforementioned torsion bars 22, and the wiring at the connection locations C of the torsion bars 22 and the fixed frame 12 and the torsion bars 22 and the movable section 14, in a further aspect, according to the second embodiment, there are provided: a supporting section, torsion bars extending on the same straight line, a movable section supported in swingable fashion with respect to the supporting section, by means of the torsion bars, and a mirror arranged on the movable section, an electrical drive element (for example a drive coil or electrode of a piezoelectric body) arranged on the movable section, and wiring connecting the electrical drive element, arranged on the torsion bars along the direction of extension of these torsion bars; wherein the wiring in the vicinity of the connection location of the torsion bars and the supporting section and the vicinity of the connection location of the torsion bars and the movable section is constituted as damascene wiring by a first metallic material constituted by Cu arranged in a groove: thus the mirror drive device can be characterized as a mirror drive device wherein the wiring in the vicinity of the middle of the torsion bars is constituted by a second metallic material that is less subject to plastic deformation than the first metallic material.

While embodiments of the present invention have been described in detail above, the present invention is not restricted to the aforementioned embodiments. For example, in the embodiments described above, mirror drive devices 1A, 1B were described, but the present invention could be applied broadly to electronic components in which a metallic material is embedded by a damascene process in the interior of a groove or concave section (recess) recessed from the periphery thereof.

In the second embodiment, the movable section 14 was described as being of circular shape, but the shape of the movable section 14 is not restricted to this. Specifically, the movable section 14 may present an octagonal shape (see FIG. 12(a)) or may present a rectangular shape (see FIG. 12(b)). Furthermore, the movable section may present a hexagonal shape. In other words, the movable section may have any shape.

In the second embodiment, the mirror 16 was described as being of circular shape, but the shape of the mirror 16 is not restricted to this. Specifically, the mirror 16 may present an octagonal shape corresponding to the shape of the movable section 14 (see FIG. 12(a)), or may present a rectangular shape corresponding to the shape of the movable section 14 (see FIG. 12(b)). Also, the mirror may present a shape different from that of the movable section. In other words, the mirror may have any shape.

In the second embodiment, an example was described in which the drive coil 18 has a construction presenting an octagonal shape as seen from the direction orthogonal to the surface 14s of the movable section 14, but the shape of the drive coil 18 is not restricted to this. As shown in FIG. 12(b), the drive coil 18 could have a rectangular shape. Also, the number of turns of the drive coil may be suitably set in accordance with the design of the mirror drive device 1B.

In the second embodiment, an example was described in which the external-connection conductors 28a, 28b were constituted so as to be covered by the insulating layer 104, but the external-connection conductors 28a, 28b could extend to the surface of the insulating layer 104.

In the second embodiment, the external-connection conductors 28a, 28b of the drive coil 18 extended as far as the electrodes 30a, 30b, through one of the torsion bars 22; however, it would be possible for example for the external-connection conductor 28a to be arranged in one of the torsion bars 22 and for the external-connection conductor 28b to be arranged in the other of the torsion bars 22. In other words, a construction could be adopted in which the external-connection conductors 28a, 28b extend as far as the electrodes 30a, 30b, respectively through one in each case of the pair of torsion bars 22. With such a construction, if either of the pair of torsion bars 22 is broken, one or other of the external-connection conductors 28a, 28b will be disconnected so that signal output will be lost: breakage of the torsion bars 22 can thus be detected using the output of this signal and operation interrupted in such cases. Also, further reduction in stress can be achieved and short-circuiting between the external-connection conductors 28a, 28b can be prevented by such a respective arrangement of the external-connection conductors 28a, 28b.

In the second embodiment, an example was described of an arrangement in which the entire drive coil 18 was arranged on the inside of the mirror 16, but it would also be possible to arrange part of the drive coil 18 on the inside of the mirror 16.

In the above embodiments, linear torsion bars 22 were described by way of example, but the construction of the torsion bars is not restricted to this, and it would be possible for example to make these of serpentine shape. FIG. 13 and FIG. 14 show an example of torsion bars 22 of serpentine shape.

While in the above embodiments an example was described of a one-dimensional drive type device, in which the mirror 16 was driven one-dimensionally by swinging the movable section 14 about the direction of extension of the torsion bars 22 (linked members) or about the direction of extension of the swinging axis, by linking the fixed frame 12 and movable section 14 by means of the pair of torsion bars 22, it would also be possible for the mirror drive device to be constituted as a two-dimensional type drive device, in which the mirror 16 is driven in two-dimensional fashion. FIG. 13 and FIG. 14 show an example of such a two-dimensional type drive device.

The construction of the mirror drive device shown in FIG. 13 and FIG. 14 will now be described, focusing on the differences with regard to the mirror drive device 1A according to the first embodiment. In the mirror drive device shown in FIG. 13, just as in the case of the mirror drive device 1A shown in FIG. 1, both of the drive coils 18, 20 surround the mirror 16. In the case of the mirror drive device shown in FIG. 14, the drive coil 18 surrounds the mirror 16 in the same way as the mirror drive device 1A according to the first embodiment; in contrast the drive coil 20 is arranged on the inside of the mirror 16 in the same way as the mirror drive device 1B according to the second embodiment.

A pair of concave sections 12a are formed on a pair of inside edges, of the four inside edges of the fixed frame 12. The pair of concave sections 12a respectively accommodate torsion bars 22 presenting a serpentine shape. The outside section 14a is swingable about a straight line A1 that extends along the direction of opposition of the pair of concave sections 12a.

The inside section 14b is mounted on the outside section 14a by means of a pair of torsion bars 24 that extend orthogonally with respect to the torsion bars 22. Specifically, the inside section 14b is swingable about a straight line A2 that is orthogonal to the straight line A1. In FIG. 13, the mirror arrangement section 14c is directly fixed to the inside of the inside section 14b without interposition of a supporting beam 26. In FIG. 14, the inside section 14b presents a circular shape and also serves as the mirror arrangement section 14c.

With the mirror drive device described above, the outside section 14a is swingable about the straight line A1 and the inside section 14b (mirror arrangement section 14c) is swingable about the straight line A2, so the mirror 16 can be driven two-dimensionally. The direction of the magnetic field F may have a prescribed angle with respect to the two axes of swinging motion, as shown in FIG. 9. In this case, it is unnecessary to provide a magnet for each swinging axis.

EXPLANATION OF THE REFERENCE SYMBOLS 1A, 1B . . . Mirror drive devices, 10 . . . Permanent magnet, 12 . . . Fixed frame, 14 . . . Movable section, 16 . . . Mirror, 18, 20 . . . Drive coils, 22, 24 . . . Torsion bars, 28a, 28b, 32a, 32b . . . External-connection conductors, 100 . . . Substrate, 100a . . . Groove, 100b . . . Insulating layer, 100c . . . Seed layer, 102 . . . Covering layer, 104 . . . Insulating layer, S1 to S4 . . . Main faces.

The invention claimed is:

1. An apparatus comprising:
a support member;
a movable member rotatably coupled to the support member, the movable member comprising a groove and a mirrored surface;
a magnet to form a magnetic field at least partially around the movable member;
a drive coil disposed at least partially in the groove;
a metallic cover layer disposed substantially over the drive coil; and
an insulation layer disposed substantially over the metallic cover layer to electrically insulate the drive coil and the cover layer, the cover layer to suppress diffusion from the drive coil into the insulating layer.

2. The apparatus of claim 1, the movable member comprising a substrate, wherein the groove is formed in a main face of the substrate.

3. The apparatus of claim 2, wherein the groove extends in a spiral on the main face.

4. The apparatus of claim 3, wherein the drive coil is disposed in the spiral groove.

5. The apparatus of claim 4, wherein the drive coil comprises a first metallic material and the metallic cover layer comprises a second metallic material different than the first metallic material.

6. The apparatus of claim 5, wherein the first metallic material comprises Cu or Au.

7. The apparatus of claim 5, wherein the second metallic material comprises Al or an Al alloy.

8. A MEMS mirror device comprising:
a movable member comprising a groove and a mirrored surface;
a magnet to form a magnetic field at least partially around the movable member;
a drive coil disposed at least partially in the groove;
a metallic cover layer disposed substantially over the drive coil; and
an insulation layer disposed substantially over the cover layer to electrically insulate the drive coil and the cover layer, the cover layer to suppress diffusion from the drive coil into the insulating layer.

9. The MEMS mirror device of claim 8, comprising an external-connection conductor electrically connected to a terminal of the drive coil.

10. The MEMS mirror device of claim 9, wherein the external-connection conductor three-dimensionally intersects the drive coil through the insulation layer.

11. The MEMS mirror device of claim 8, the movable member comprising a substrate, wherein the groove is formed in a main face of the substrate.

12. The MEMS mirror device of claim 11, the insulation layer a first insulating layer, the MEMS mirror device comprising a second insulating layer disposed on the main face of the substrate between the groove and the drive coil.

13. The MEMS mirror device of claim 12, wherein the substrate comprises silicon, wherein the second insulating layer comprises silicon oxide, and wherein the silicon oxide is produced by thermal oxidation of silicon.

14. The MEMS mirror device of claim 13, comprising a seed layer disposed between the second insulating layer and the drive coil.

15. The MEMS mirror device of claim 14, wherein the seed layer comprises TiN.

16. The MEMS mirror device of claim 11, wherein the groove extends in a spiral on the main face.

* * * * *